United States Patent
Wang et al.

(10) Patent No.: US 7,031,361 B2
(45) Date of Patent: Apr. 18, 2006

(54) EDGE EMITTING LASER WITH CIRCULAR BEAM

(75) Inventors: Jyh-Shyang Wang, Hsinchu (TW); Gray Lin, Hsinchu (TW); Alexey R Kovsh, Hsinchu (TW); Daniil Alexandrovich Livshits, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 264 days.

(21) Appl. No.: 10/743,148

(22) Filed: Dec. 23, 2003

(65) Prior Publication Data

US 2005/0089072 A1    Apr. 28, 2005

(30) Foreign Application Priority Data

Oct. 24, 2003  (TW) .............................. 92129664 A

(51) Int. Cl.
*H01S 3/04* (2006.01)
*H01S 5/00* (2006.01)

(52) U.S. Cl. ............................... 372/43.01; 372/46.014

(58) Field of Classification Search ............. 372/43.01, 372/46.014
See application file for complete search history.

(56) References Cited

U.S. PATENT DOCUMENTS 5,289,484 A * 2/1994 Hayakawa ................ 372/45.01
5,815,521 A * 9/1998 Hobson et al. ............ 372/45.01
2004/0047378 A1* 3/2004 Erbert et al. ................. 372/44

OTHER PUBLICATIONS

Lin et al. "Extremely Small Vertical Far-Field Angle of InGaAs-AlGaAs Quantum-Well Lasers with Specifically Designed Cladding Structure", IEEE Photonics Technology Letters, vol. 8, No. 12, pp. 1588-1590.*
Jeon et al. IEEE Journal of Selected Topics in Quantum Electronics, vol. 3 No. 6, pp. 1344-1350.*

* cited by examiner

*Primary Examiner*—Zandra Smith
*Assistant Examiner*—Marcia A. Golub
(74) *Attorney, Agent, or Firm*—Birch, Stewart, Kolasch & Birch, LLP

(57) ABSTRACT

An edge emitting laser with circular beam using a low-carrier-mobility diluted nitride semiconductor material for an epitaxy light-emitting layer is disclosed. The low-carrier-mobility material can greatly suppress surface recombination of carriers. The epitaxy structure established on the substrate surface includes, from bottom to top, a bottom cladding layer, a bottom waveguide layer, a light-emitting layer, an upper waveguide layer, an upper cladding layer, and an electrode contact layer. The light-emitting layer is formed from a diluted nitride material. Etching is performed from the epitaxy structure through the light-emitting layer, forming a ridge waveguide that has a large reflective index difference between the light-emitting layer and the dielectric passivation layer.

4 Claims, 5 Drawing Sheets

EDGE EMITTING LASER WITH CIRCULAR BEAM

BACKGROUND OF THE INVENTION

1. Field of Invention

This nonprovisional application claims priority under 35 U.S.C. § 119(a) on Patent Application No(s). 92129664 filed in TAIWAN, R.O.C. on Oct. 24, 2003, which is(are) herein incorporated by reference.

The invention relates to an edge emitting laser and, in particular, to a edge emitting laser with circular beam that uses a low-carrier-mobility material.

2. Related Art

Semiconductor lasers have the features of compact sizes, long lifetime, good vibration tolerance, being highly directional, and large output power. They are ideal for the light sources of long-distance, large-capacity communications and high-density recording media. Currently, most of their applications are in optical communications and storage industries. Therefore, the semiconductor lasers have a brighter future.

According to their structures and light-emitting position, the semiconductor lasers are divided into surface-emitting lasers and edge emitting lasers. The cavity of the edge emitting laser is parallel to the epitaxy layer. The reflecting surface is formed by coating a reflecting film on the cutting surface of a crystal. It is perpendicular to the epitaxy layer. Light reflects between two side mirrors (i.e. inside the cavity) and sends out a laser beam through a side surface. Since the thickness of ridge waveguide is much larger than active region, the light intensity distribution is a vertical ellipse. Thus, it has a very bad coupling efficiency, limiting its applications.

Consequently, we want to use a specially designed edge emitting laser structure to improve the roundness of the laser beam. A vertical groove through the light-emitting layer is formed using an etching means, thereby generating a horizontal light diffractive index difference. Total reflection occurs between the light-emitting layer and the medium with a lower reflective index. Horizontal light is thus trapped inside the light-emitting layer. This increases the spreading angle of the laser beam in the horizontal direction, achieving the goal of a circular beam. The light-emitting layer material used in conventional edge emitting laser with circular beams has series carrier surface recombining effects at the etching interface, resulting in a low light-emitting efficiency. Therefore, after etching though the light-emitting layer the groove thus formed has to be grown with the epitaxy of other semiconductor materials, forming the so-called buried ridge waveguide. However, such a structure does not only involve complicated manufacturing processes but also has a higher cost. The reflective index difference between the semiconductor material and the light-emitting layer material is smaller. As a result, the roundness of the circular beam is not perfect.

SUMMARY OF THE INVENTION

The invention provides a edge emitting laser with circular beam. It uses a low-carrier-mobility semiconductor compound for the light-emitting layer. The low-carrier-mobility material can greatly suppress surface recombination of the carriers. Therefore, one can form a ridge waveguide by simply etching through the light-emitting layer without the step of epitaxy growth. The invention thus provides a low-cost, high-efficiency edge emitting laser with circular beam.

The invention uses a low-carrier-mobility material to form the light-emitting layer of the edge emitting laser with circular beam. It is formed by establishing an epitaxy structure of a substrate surface. It includes, stacked from bottom to top, a bottom cladding layer, a bottom waveguide layer, a light-emitting layer, an upper waveguide layer, an upper cladding layer, and an electrode contact layer. The light-emitting layer is formed using a low-carrier-mobility material with diluted nitrides. Etching starts from the surface of the epitaxy structure through the light-emitting layer, forming the ridge waveguide. Since the low-carrier-mobility material can suppress surface recombination of carriers, there is no need for the epitaxy growth of a low-reflective-index semiconductor material on the sides of the ridge waveguide. The reflective index of dielectric passivation is even smaller than normally used low-reflective-index semiconductor material. The large reflective index difference between the light-emitting layer and the dielectric passivation layer can more effectively restrict the horizontal light within the light-emitting layer, increasing the spreading angle of the laser beam in the horizontal direction and the roundness of the circular laser beam.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
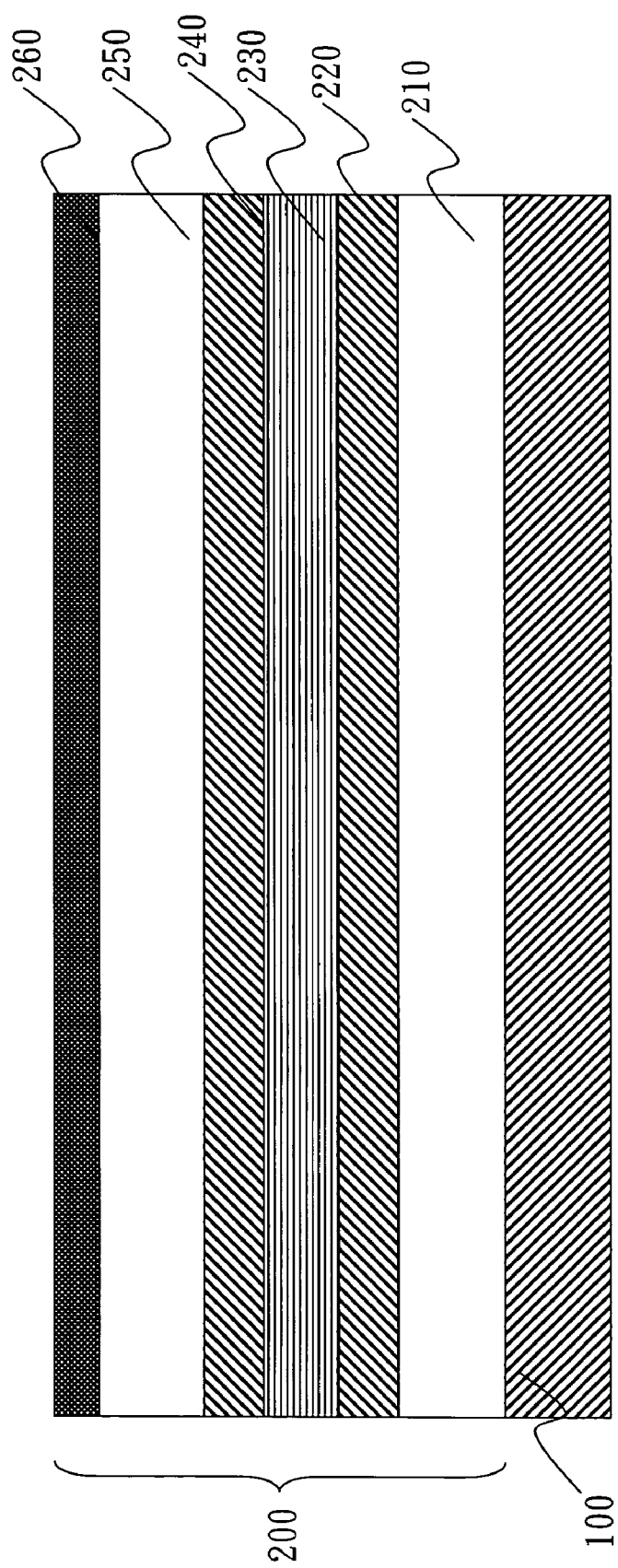
FIG. 1 is a schematic view of the epitaxy structure according to the disclosed embodiment.
Figure 2:
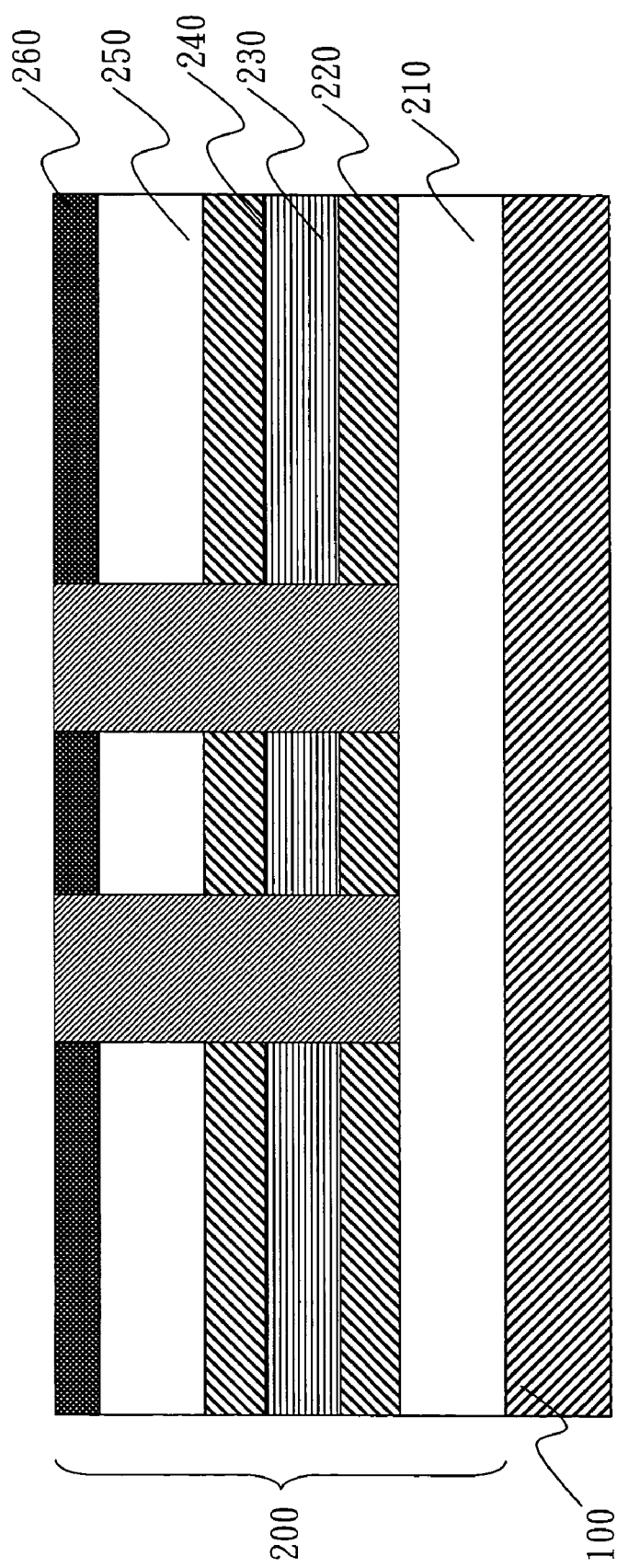
FIG. 2 is a schematic view of etching the epitaxy structure in the embodiment.

As shown in FIG. 1, the epitaxy structure 200 according to an embodiment of the invention is formed on the upper surface of a substrate 100, from bottom to top, a bottom cladding layer 210, a bottom waveguide layer 220, a light-emitting layer 230, an upper waveguide layer 240, an upper cladding layer 250, and an electrode contact layer 260. The light-emitting layer 230 is formed using the semiconductor material $In_vGa_wAl_{1-v-w}As_xP_yN_zSb_{1-x-y-z}$ (0<v,w,x,y,z<1) that contains diluted nitrides With reference to FIG. 2, combining lithography and etching techniques, the epitaxy structure is etched to form a groove through the light-emitting layer 230. Etching starts from the surface of the epitaxy structure 200 through the light-emitting layer 230 to form a ridge waveguide.

Figure 3:
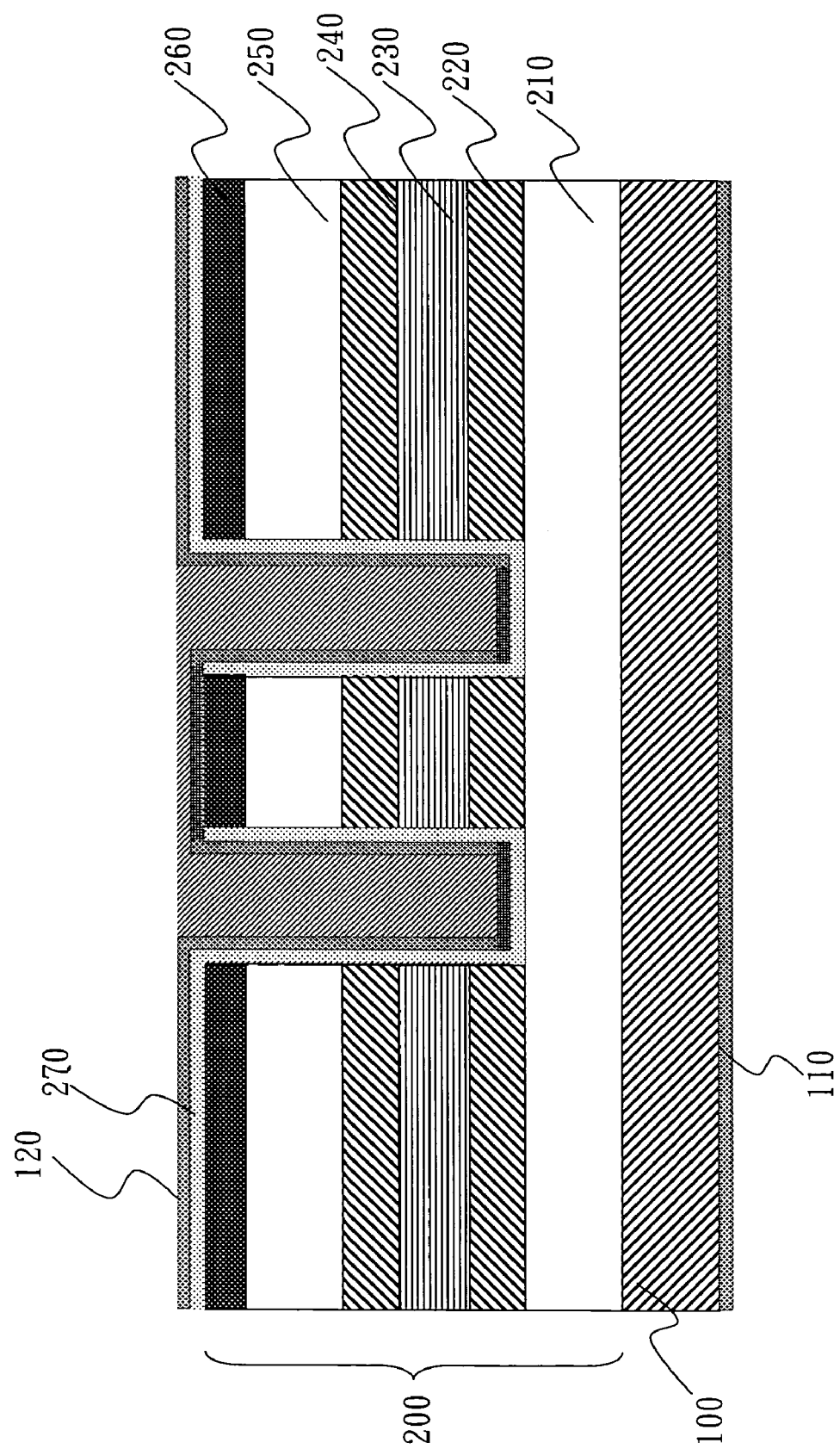
FIG. 3 is a schematic view of forming the electrodes in the embodiment.

With reference to FIG. 3, a passivation dielectric layer 270 is formed on the surface of the epitaxy structure 200. The ridge waveguide region of the dielectric layer 270 is exposed by etching. A P-type metal is deposited on the dielectric layer 270 and the exposed ridge waveguide as the upper electrode layer 120. An N-type metal is deposited on the back-side surface of the substrate as the bottom electrode layer 110. The electrical current is thus restricted to flow through the ridge waveguide, exciting the light-emitting layer inside the ridge waveguide.

Figure 4:
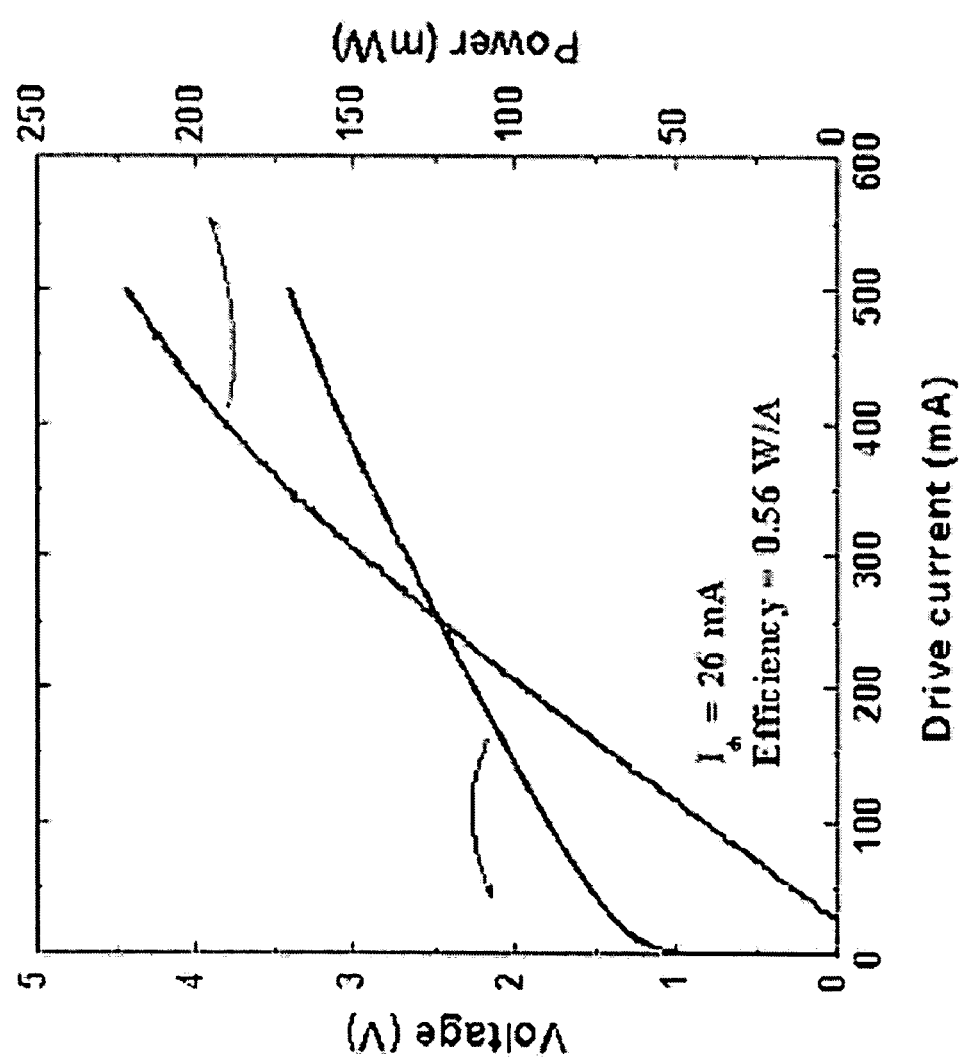
FIG. 4 shows the current-voltage and current-power relations.

FIG. 4 shows that the embodiment has good opto-electric characteristics. As shown in the plot, the threshold current is 26 mA, the light-emitting efficiency is 0.56 W/A, the output power is over 200 mW, and the device resistance is only 4.8Ω. The light-emitting layer formed from a semiconductor material containing diluted nitrides can greatly suppress surface recombination of carriers. Thus, there is no need to fill the groove on the side of the ridge waveguide with a low-reflective-index material through epitaxy growth. Moreover, the full width half maximum (FWHM) ratio between horizontal and vertical light is about 1.26. The laser beam thus generated is very close to a true circular distribution.

Figure 5:
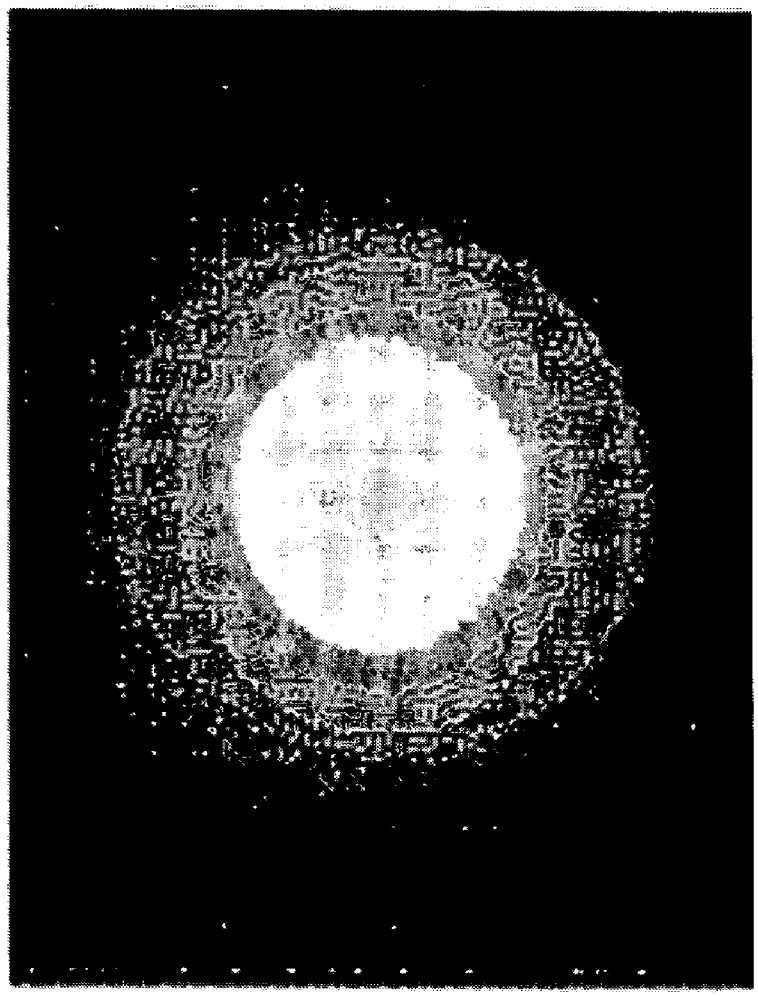
FIG. 5 shows the far-field light spot distribution in the embodiment.

FIG. 5 shows the far-field light spot distribution according to the embodiment. It shows that the ridge waveguide can effectively trap light traveling in the horizontal direction to form a single-mode and circularly distributed laser beam.

Certain variations would be apparent to those skilled in the art, which variations are considered within the spirit and scope of the claimed invention.

What is claimed is:

1. An edge emitting laser with circular beam, comprising:
    a substrate; and
    an epitaxy structure, which is formed on the upper surface of the substrate to form a ridge waveguide and includes, from bottom to top, a bottom cladding layer, a bottom waveguide layer, a light-emitting layer, an upper waveguide layer, an upper cladding layer, and an electrode contact layer;
    wherein the light-emitting layer is formed from a low-carrier-mobility material that contains diluted nitrides, the ridge waveguide is formed by etching from the surface of the epitaxy structure through the light-emitting layer, and the low-carrier-mobility material is $In_vGa_wAl_{1-v-w}As_xP_yN_zSb_{1-x-y-z}$ with $0<v,w,x,y,z<1$.

2. The edge emitting laser with circular beam of claim 1, wherein the top surface of the ridge waveguide is formed with an upper electrode layer and the back-side surface of the substrate is formed with a bottom electrode layer, trapping the electrical current to flow through the light-emitting layer of the ridge waveguide.

3. The edge emitting laser with circular beam of claim 1, wherein the upper electrode layer is formed using a P-type metal and the bottom electrode layer is formed using an N-type metal.

4. The edge emitting laser with circular beam of claim 1, wherein the ridge waveguide is formed through lithography and etching processes.

* * * * *